(12) United States Patent
Inobe et al.

(10) Patent No.: US 8,415,693 B2
(45) Date of Patent: Apr. 9, 2013

(54) LIGHT EMITTING SEMICONDUCTOR DEVICE AND METHOD OF MANUFACTURE THEREOF

(75) Inventors: Mototaka Inobe, Anan (JP); Motokazu Yamada, Tokushima (JP); Kazuhiro Kamada, Tokushima (JP)

(73) Assignee: Nichia Corporation, Anan-shi (JP)

( * ) Notice: Subject to any disclaimer, the term of this patent is extended or adjusted under 35 U.S.C. 154(b) by 180 days.

(21) Appl. No.: 12/695,163

(22) Filed: Jan. 28, 2010

(65) Prior Publication Data

US 2010/0193822 A1    Aug. 5, 2010

(30) Foreign Application Priority Data

Jan. 30, 2009   (JP) .................................. 2009-19412
Nov. 26, 2009   (JP) ................................ 2009-268587

(51) Int. Cl.
*H01L 33/00*      (2010.01)
(52) U.S. Cl. ...... 257/98; 257/99; 257/100; 257/E33.056
(58) Field of Classification Search .................... 257/98, 257/99, 100, E33.056
See application file for complete search history.

(56) References Cited

U.S. PATENT DOCUMENTS

| | | | | |
|---|---|---|---|---|
| 2006/0267042 | A1* | 11/2006 | Izuno et al. | 257/100 |
| 2008/0054287 | A1* | 3/2008 | Oshio et al. | 257/99 |
| 2009/0102067 | A1* | 4/2009 | Wyland | 257/784 |
| 2009/0256171 | A1* | 10/2009 | Takei et al. | 257/100 |

FOREIGN PATENT DOCUMENTS

| | | |
|---|---|---|
| JP | 2004-207258 | 7/2004 |
| JP | 2005-26401 | 1/2005 |
| JP | 2006-303069 | 11/2006 |
| JP | 2007-324256 | 12/2007 |

* cited by examiner

*Primary Examiner* — Tan N Tran
(74) *Attorney, Agent, or Firm* — Ditthavong Mori & Steiner, P.C.

(57) ABSTRACT

The light emitting device has a substrate, metallization including silver established on the surface of the substrate, a light emitting element mounted on the substrate, conducting wire that electrically connects the metallization and the light emitting element, light reflective resin provided on the substrate to reflect light from the light emitting element, and insulating material that covers at least part of the metallization surfaces. The insulating material is established to come in contact with the side of the light emitting element. This arrangement can suppress the leakage of light emitting element light from the substrate, and can achieve a light emitting device with high light extraction efficiency.

43 Claims, 4 Drawing Sheets

LIGHT EMITTING SEMICONDUCTOR DEVICE AND METHOD OF MANUFACTURE THEREOF

BACKGROUND OF THE INVENTION

1. Field of the Invention

The present invention relates to a light emitting device that can be used in applications such as an indicator device, lighting equipment, display monitor, or backlight source for a liquid crystal display, and to the method of manufacturing the light emitting device. More particularly, the present invention relates to a light emitting device and its method of manufacture that has exceptional light extraction efficiency as well as high reliability.

2. Description of the Related Art

In recent years, various light emitting devices such as light emitting diode (LED) and laser diode (LD) apparatus that employ high output semiconductor light emitting elements (also referred to below simply as light emitting elements) have been developed.

Recently, an assortment of electronic components have been proposed and developed, and demands on their performance has also increased. In particular, long-term, stable performance is demanded even in harsh operating environments. Similarly, for light emitting devices beginning with light emitting diodes, performance demands in fields such as general lighting and automotive lighting are increasing daily, and high output and high reliability are particularly in demand. Furthermore, supply of these devices at low prices while maximizing their performance is required.

In general, a light emitting device has a substrate that carries electronic components such as semiconductor light emitting elements (also referred to below as light emitting elements) and protection devices, and conducting material to supply electrical power to those electronic components. Further, the light emitting device has light-transparent encapsulating material to protect the electronic components from the outside environment.

To achieve high output, the output of the employed light emitting elements themselves can be increased. In addition, it is effective to improve the light extraction efficiency via the materials and configuration of components such as the substrate, the conducting material, and the encapsulating material.

For example, high conductivity metals are used as the conducting material, and the surface of the conducting material can be plated with silver to efficiently reflect light from the light emitting elements. Further, resin that easily passes light from the light emitting elements is appropriate as the encapsulating material. Among those resins, silicone resin, which has excellent heat durability and is able to withstand harsh environments (weather-ability), can be used in an effort to increase apparatus lifetime.

However, silver has the tendency to degrade easily due to atmospheric constituents such as sulfur. Accordingly, Japanese Laid-Open Patent Publication No. 2004-207258A discloses use of an organic agent to prevent silver discoloration. In addition, Japanese Laid-Open Patent Publication No. 2006-303069A discloses plating the silver with a noble metal, and Japanese Laid-Open Patent Publication No. 2007-324256A discloses a sol-gel glass coating.

In addition, light emitting devices that carry not only light emitting elements, but also carry electronic components such as Zener diodes or submounts have been developed. As a result, high reliability, long lifetime light emitting devices are possible. Since these other types of electronic components can easily absorb light from the light emitting elements, a reflective layer can be provided that covers those components and reduces light loss (see for example, Japanese Laid-Open Patent Publication No. 2005-26401A).

However, in the case of organic material covering silver, environmental resistance is problematic and the system can easily degrade over time. For noble metal plating, although environmental resistance is not a problem, noble metals have lower reflectance than silver and initial reduction in output is unavoidable.

Further, the thickness of sol-gel glass coating is difficult to control, mass production is problematic, and as a result cost is an obstacle.

The present invention was developed considering these types of problems with the prior art. Thus, it is a primary object of the present invention to suppress the degradation of silver used in metallization for electrodes, and to provide a high output, high reliability light emitting device and method of manufacture.

SUMMARY OF THE INVENTION

To achieve the object described above, a light emitting device for the first aspect of the present invention has a substrate, metallization that has metal including silver established on the surface of the substrate, light emitting elements mounted on the substrate, conducting wire that electrically connects the metallization and the light emitting elements, light reflective resin provided on the substrate to reflect light from the light emitting elements, and insulating material that covers at least part of the metallization surfaces. In addition, the insulating material can be provided to contact the sides of the light emitting elements.

In addition, a light emitting device manufacturing method for another aspect of the present invention can include a process step to provide a substrate that has a first cavity, and second cavities inside the first cavity with bottom surfaces positioned below the first cavity; a process step to provide metallization on the upper surface of the substrate; a process step to provide light emitting elements on top of the metallization and connect the metallization and light emitting elements with conducting wire; a process step to cover continuously with insulating material the surfaces of metallization on the bottom surfaces inside the second cavities, the side-walls joining the first and second cavities, the surface of metallization in the first cavity, surfaces of the light emitting elements, and the conducting wire; and a process step to provide light reflective resin in the second cavities to reflect light from the light emitting elements.

In this manner, leakage of light from the light emitting elements through the substrate can be suppressed to obtain a light emitting device with high light extraction efficiency. In particular, leakage of light from the light emitting elements through the substrate can be prevented, light reflective resin can be provided near the light emitting elements to efficiently reflect light, and silver degradation can be effectively suppressed to attain a light emitting device with improved light extraction efficiency. Further, when protection devices and conducting wire are used, light absorption by those components can be suppressed to obtain a light emitting device with little light loss.

The above and further objects of the present invention as well as the features thereof will become more apparent from the following detailed description to be made in conjunction with the accompanying drawings.

DETAILED DESCRIPTION OF THE EMBODIMENT(S)

Figure 1A:
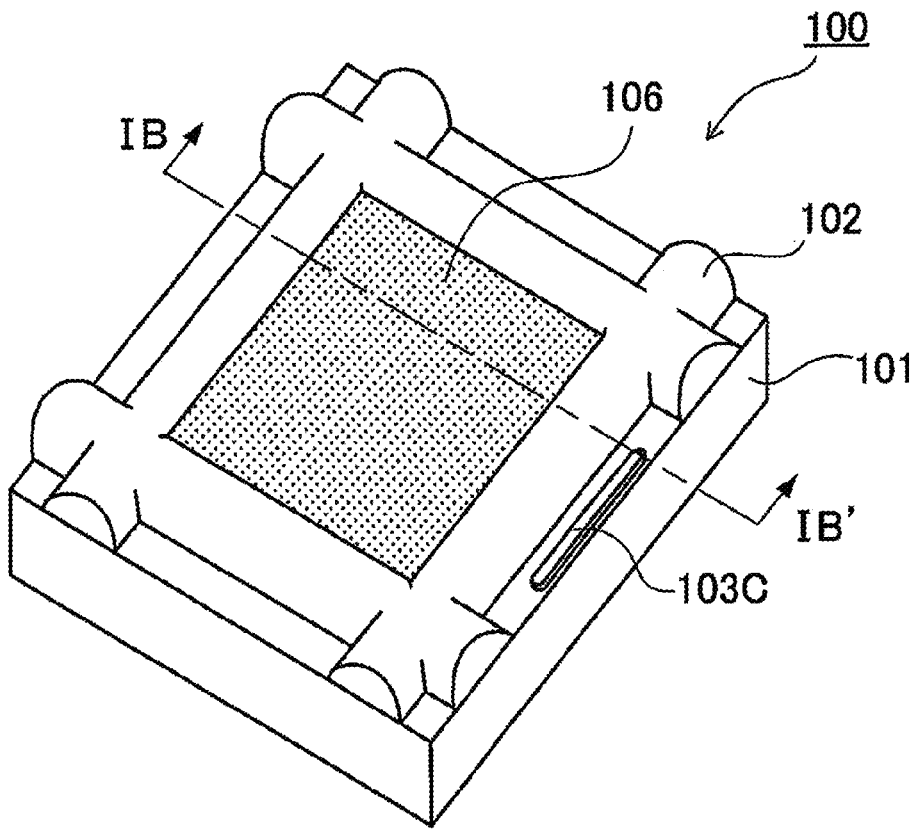
FIG. 1A is an oblique view showing a light emitting device for the first embodiment of the invention.

In the light emitting device, the substrate can have cavities with side-walls and bottom surfaces, the cavities can have a first cavity with light emitting elements attached and second cavities inside the first cavity having bottom surfaces positioned below the first cavity, and light reflective resin can be provided on metallization inside the second cavities.

Further, side-walls that join the second cavities to the first cavity can be covered with insulating material.

Still further, light reflective resin can extend upward from the second cavities to a position above the first cavity.

Still further, the light emitting device can have a substrate, metallization that has metal including silver established on the surface of the substrate, light emitting elements mounted on the substrate, conducting wire that electrically connects the metallization and the light emitting elements, light reflective resin provided on the substrate to reflect light from the light emitting elements, and insulating material that covers at least part of the metallization surfaces. In addition, the insulating material can be provided continuously over the upper surfaces of the metallization and the light emitting elements. In this manner, light leakage from the light emitting elements through the substrate can be suppressed and a light emitting device with high light extraction efficiency can be produced. In particular, since leakage of light from the light emitting elements through the substrate can be prevented, since light reflective resin can be provided near the light emitting elements to efficiently reflect light, and since silver degradation can be effectively suppressed, a light emitting device with improved light extraction efficiency can be produced. Furthermore, when conducting wire and protection devices are used; light absorption by those components can be suppressed to easily realize a light emitting device with minimal light loss.

Still further, the insulating material can be provided between the metallization and the light reflective resin, and that insulating material can extend continuously over the upper surfaces of the light emitting elements.

Still further, the insulating material can be provided on the surface of the light reflective resin, and that insulating material can extend continuously over the upper surfaces of the light emitting elements.

Still further, the insulating material can be provided over the upper surfaces of the light emitting elements and extend to cover the surfaces of the conducting wire.

Still further, essentially the entire upper surface of the substrate can be covered by the insulating material.

Still further, encapsulating material can be provided to enclose the light emitting elements, essentially all of the conducting wire, and at least part of the insulating material on the upper surface of the substrate.

Still further, the insulating material can have light-transparent properties.

Still further, the insulating material can be an inorganic compound.

Still further, the insulating material can be $SiO_2$.

Still further, the light emitting elements are mounted on top of the metallization and the metallization can function as electrodes.

First Embodiment

Figure 1B:
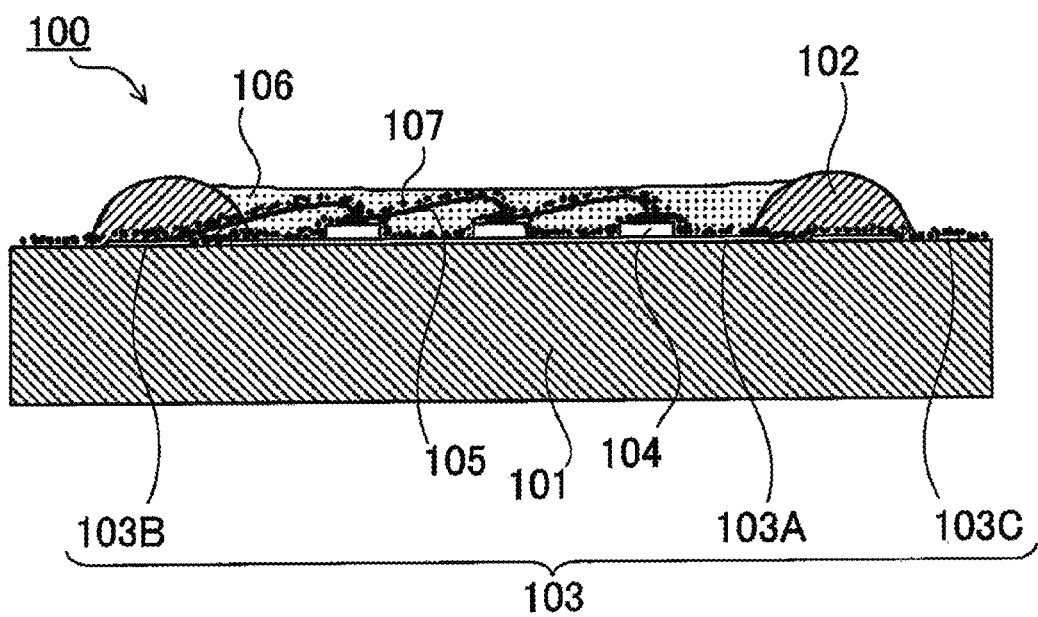
FIG. 1B is a cross-section view through IB-IB' on the light emitting device of FIG. 1A.

The following describes embodiments of the present invention based on the figures. First, FIGS. 1A and 1B show a light emitting device 100 for the first embodiment. FIG. 1A is an oblique view of the light emitting device 100, and FIG. 1B is a cross-section view through IB-IB' on the light emitting device 100 shown in FIG. 1A. In this embodiment, the light emitting device 100 has an approximately rectangular substrate 101 with metallization 103A, 103B, 103C disposed on its upper surface, and a plurality of light emitting elements 104 mounted on the metallization 103A established on the upper surface of the substrate 101. Metallization 103A, 103B used as electrodes and the light emitting elements 104 are directly or indirectly connected electrically via conducting wire 105. Although metallization 103C is the same material as metallization 103A, 103B, which act as electrodes, it is not an electrically connected component, and is provided as a marker (cathode mark, anode mark) indicating the polarity of the light emitting device.

In the present embodiment, light reflective resin 102 is provided around the light emitting elements 104 to reflect light from the light emitting elements, insulating material 107 is established between the metallization 103A, 103B and the light reflective resin 102, and the insulating material 107 is established to extend continuously over the tops of the light emitting elements 104. Further, the inside of the cavity formed by side-walls of the light reflective resin 102 is filled with light-transparent encapsulating material 106 to protect components such as the light emitting elements 104 from the external environment. As a result of this structure, degradation of the silver plating on the metallization can be suppressed by the insulating material, and light that could leak through the substrate via regions between the positive and negative electrodes, where structurally silver cannot be established, can be efficiently reflected by the light reflective resin.

(Light Reflective Resin)

The light reflective resin is a material that can efficiently reflect light from the light emitting elements. As shown in FIGS. 1A and 1B, the light reflective resin 102 is established in a manner that surrounds the light emitting elements 104. The light reflective resin 102 is established in a manner that covers part of the metallization 103A, 103B. Insulating material 107 is established between the metallization and the light reflective resin, and extends continuously over the light emitting elements 104. This type of structure can easily be obtained by mounting the light emitting elements on the metallization, establishing insulating material 107 over the entire substrate 101, and subsequently forming the light reflective resin 102. In this manner, since insulating material can be established even on top of metallization buried under the light reflective resin, silver (Ag) discoloration can be suppressed more effectively. In addition, the insulating material 107 functions as a passivation layer that can suppress Ag migration. Depending on the structural materials, the insulating material can also improve adhesion of resin regions such as the light reflective resin 102 to the silver.

To more concretely describe the material constituent of the light reflective resin, an insulating material is preferable, and a material, which does not easily absorb or transmit light from the light emitting elements or from a source such as external light, is preferable. Further, a material with some degree of strength such as a thermosetting resin or a thermoplastic resin can be used. More specifically, resins such as phenol resin, epoxy resin, BT resin, PPA resin, and silicone resin can be utilized. In these resin bases, powders such as reflecting materials (for example, $TiO_2$, $Al_2O_3$, $ZrO_2$, and MgO), which do not easily absorb light from the light emitting elements and have a large difference in index of refraction compared to the resin base, can be distributed to enable efficient light reflection.

These types of light reflective resins can be formed and patterned using methods such as potting methods, printing methods, and direct writing methods. For example, as shown in FIG. 1A, for the case where light reflective resin forms a frame surrounding the light emitting elements on an approximately planar substrate, a resin with a somewhat high viscosity can be used to form light reflective resin that after hardening protrudes from a horizontal plane higher than the light emitting elements. That resin can be extruded from the tip of a nozzle to form light reflective resin in straight lines. Subsequently, light reflective resin can be extruded in straight lines perpendicular to the previously formed lines to directly write a pattern that forms a plurality of light emitting devices.

(Insulating Material)

Insulating material is provided between the metallization and light reflective resin, and is established continuously extending over the light emitting elements. Here, as shown in FIG. 1B and other figures, "established continuously" includes insulating material established in particulate or needle form over essentially the entire region with some spaces. For example, this includes layers formed from inorganic particulates by sputter deposition or (physical) vapor deposition. Ingress of gases and moisture etc. that can degrade silver on the surface of the metallization can be blocked by these insulating materials. Therefore, in a light emitting device with output efficiency increased by light reflective resin, silver degradation, which could diminish this outstanding result, can be effectively suppressed. Further, as shown in FIG. 1B, by establishing the insulating material after connecting the metallization with conducting wire, the insulating material can also be formed continuously on the conducting wire 105. In this manner, adhesion between the conducting wire and the encapsulating material and the light reflective resin can be improved.

For insulating material, light transparent material is preferable, and primarily the use of inorganic compounds is desirable. Specifically, oxides such as $SiO_2$, $Al_2O_3$, $TiO_2$, $ZrO_2$, $ZnO_2$, $Nb_2O_5$, MgO, SrO, $In_2O_3$, $TaO_2$, HfO, SeO, $Y_2O_3$, nitrides such as SiN, AlN, AlON, and fluorides such as $MgF_2$ can be utilized. These compounds can be used singly, they can be mixed, or they can be layered.

With respect to insulating material thickness, a thin layer is preferable to avoid light loss due to multiple reflections at each interface between the encapsulating material, the insulating material, and the metallization. Conversely, a thickness sufficient to block the passage of gases that include sulfur components is necessary. Although the desirable layer thickness varies somewhat depending on the materials used, approximately 1 nm to 100 nm is preferable. For the case of multiple layers, it is preferable for the total thickness to be within this desirable layer thickness range. Further, it is preferable to form a dense layer that makes passage of a gas such as sulfur difficult.

(Substrate)

The substrate is an insulating substance in approximately sheet form that can have an open cavity in its upper surface, has metallization disposed as conductive wiring (conductive runs), and can carry mounted components such as light emitting elements and protection devices. Specifically, materials such as ceramics, epoxy resin, and polyimide resin can be utilized. In particular, by using ceramics as the primary material, a substrate can be made with exceptional ability to withstand heat and environmental conditions.

As ceramics, alumina, aluminum nitride, mullite, silicon carbide, or silicon nitride can be used. Ceramics can be made with these materials used as the primary constituents for production. For example, in the case of alumina, 90-96% by weight alumina can be used as the raw material powder, and approximately 4-10% by weight of a sintering aid such as clay, talc, magnesia, calcia, or silica can be added. This mixture can be sintered in a temperature range of approximately 1500-1700° C. to obtain a ceramic for use as a substrate. Or, 40-60% by weight alumina can be used as the raw material powder, and approximately 60-40% by weight of a sintering aid such as boro-silicate glass, cordierite, forsterite, or mullite can be added. This mixture can be sintered in a temperature range of approximately 800-1200° C. to obtain another ceramic for use as a substrate.

Further, ceramic powder and binder resin can be mixed to obtain a material that can be prepared in sheet-form to produce green sheets. A substrate of prescribed shape can be made by laminating and firing these green sheets. Further, ceramic green sheets with through-holes of various sizes can be laminated to make substrates that have cavities. At the stage prior to firing the ceramic green sheets, metallization can be disposed on these types of substrates. Conductive paste that includes micro-particles of a high-melting-point metal such as tungsten or molybdenum can be applied to the ceramic green sheet in a prescribed pattern and fired. After firing the ceramic green sheets, the pre-formed metallization can be plated with a metal such as nickel, gold, or silver.

Here, for ceramic material substrates, the metallization (conductive runs) and insulating substrate material (ceramics) can be formed in one process as described above. In addition, metallization can also be formed on pre-fired ceramics in sheet form.

For the case of glass epoxy resin used as a substrate, copper sheet is attached to pre-impregnate half-hardened epoxy resin or glass-cloth impregnated epoxy resin and then thermally hardened. Subsequently, a metallized substrate can be formed by patterning the copper in a prescribed configuration via photolithographic methods.

(Metallization)

In the present embodiment, the metallization is metal containing silver, it is formed on the upper surface of the substrate, it can extend continuously to the backside of the substrate through the inside of the substrate or via substrate surfaces, and it has the function of making external electrical connection. There are various selections for the size and pattern of the metallization, and it can be formed in large patterns to bury the edge regions under light reflective resin 102. Preferably, in a region surrounded by light reflective resin, metallization is provided in a manner that avoids exposure of the substrate. Specifically, it is preferable to establish metallization over the entire surface of the region inside the light reflective resin. In this manner, leakage of light through the substrate, which is material such as a ceramic, to the backside can be suppressed. Further, the metallization includes regions that do not electrically connect to the outside, but rather function as light reflecting material. Specifically, in addition to metal containing silver, metals such as aluminum, gold, platinum, tungsten, iron, and nickel, as well as alloys such as iron-nickel alloy, phosphor bronze, and copper-iron alloy can be utilized. In addition, these metals can be used individually or they can be used in a plurality of layers. In particular, it is preferable to form a silver-including metal on the surface, and more preferable to form silver plating on the surface.

(Encapsulating Material)

The encapsulating material is material that fills the inside of the cavity (the region surrounded by light reflective resin) and protects the electronic components such as the light emitting elements and conducting wire from dust, dirt, moisture, and external forces. In addition, the encapsulating material has light transparent properties to pass light from the light emitting elements, and preferably has the ability to withstand light transmission without easily degrading. Insulating resin composites that are transparent to light from the light emitting elements such as silicone resin composites, modified silicone resin composites, epoxy resin composites, modified epoxy resin composites, and acrylic resin composites are specific examples of materials that can be utilized as the encapsulating material. In addition, resins such as silicone resin, epoxy resin, urea resin, fluoro resin, and hybrid resins that include at least one or more of these resins can also be used. Further, encapsulating material is not limited to these organic compounds, and inorganic materials such as glass and silica gel can also be used. In addition to these materials, substances such as coloring agents, light diffusing agents, filler, and wavelength converting agents (fluorescent materials) can be included depending on requirements. The proper amount of encapsulating material used is an amount that covers the previously mentioned electronic components.

The shape of the surface of the encapsulating material can be selected from various options depending on the desired light distribution characteristics. For example, directional characteristics of the light can be controlled by forming shapes such as convex lens shapes, concave lens shapes, and Fresnel lens shapes. Further, a lens material that is a different material than the encapsulating material can also be provided.

(Die-Bond Material)

The die-bond material is a bonding material for mounting components such as the light emitting elements and protection devices on the substrate or metallization. Either conductive die-bond material or insulating die-bond material can be selected depending on the body (substrate-body) of the active components. For example, in the case of semiconductor light emitting elements that are nitride semiconductor layers grown on an insulating sapphire substrate-body, either conductive die-bond material or insulating die-bond material can be used. In the case where a conductive substrate such as SiC is used, electrical connection can be made by using conductive die-bond material. Bonding materials such as epoxy resin and silicone resin can be used as insulating die-bond. When these types of resins are used, die-bond material degradation due to light and heat from the light emitting elements is considered and the backside of the semiconductor light emitting elements can be provided with a high reflectivity metal such as Al. In this case, methods such as physical vapor deposition, sputter deposition, or thin film junction techniques can be used. Conductive pastes such as silver paste, gold paste, and palladium paste, or materials such as Au—Sn eutectic solder and low melting point metal brazing material can be used as conductive die-bond. Further, among these die-bond materials, particularly in the case where a light transparent die-bond material is used, fluorescent material can be added to absorb light from the light emitting elements and re-emit light converted to a different wavelength.

(Conducting Wire)

Wire such as gold, copper, platinum, aluminum, and alloys of these metals can be utilized as conducting wire to connect light emitting element electrodes and the metallization (conducting material) established on the substrate. In particular, use of gold wire with its superior properties such as thermal resistance is preferable. As shown in figures such as FIG. 1B, conducting wire 105 can be established to connect continuously between the light emitting elements 104, or the conducting wire can also connect to the conducting material on the substrate at each light emitting element.

(Wavelength Converting Material)

In the previously described encapsulating material/lens material, fluorescent material can be included as a wavelength converting material that absorbs at least part of the light from the semiconductor light emitting elements and re-emits light at a different wavelength.

As fluorescent material, materials that convert light from the semiconductor light emitting elements to a longer wavelength are more efficient. The fluorescent material can be one type of fluorescent substance formed as a single layer, two or more types of fluorescent substances mixed and formed as a single layer, two or more layers with each layer including one type of fluorescent substance, or two or more layers with each layer including two or more types of fluorescent substances mixed together.

For example, the fluorescent material can be wavelength converting material that absorbs light from semiconductor light emitting elements that have nitride-based semiconductor light emitting layers, and converts that light to a different wavelength. For example, preferable materials include fluorescent material primarily of activated nitride and oxide systems of lanthanoide elements such as Eu and Ce, fluorescent material primarily of activated alkaline-earth halogen apatites based on lanthanoide series elements such as Eu and transition-metal elements such as Mn, alkaline-earth metal halogen borate fluorescent material, alkaline-earth metal aluminate fluorescent material, and fluorescent material of at least one or more substance selected from an alkaline-earth silicate, alkaline-earth sulfide, alkaline-earth thiogallate, alkaline-earth silicon nitride, germinate, a material primarily of activated rare-earth aluminate of lanthanoide series elements such as Ce, and a material primarily of activated organic or organic complex of lanthanoide series elements such as Eu or rare-earth silicates. Preferably, the material is a YAG fluorescent material that is primarily an activated rare-earth aluminate of lanthanoide series elements such as Ce with a chemical formula $Y_3Al_5O_{12}$:Ce, $(Y_{0.8}Gd_{0.2})_3Al_5O_{12}$:Ce, $Y_3(Al_{0.8}Ga_{0.2})_5O_{12}$:Ce, or $(Y, Gd)_3(Al, Ga)_5O_{12}$. In addition, elements such as Tb and Lu can also replace part or all of the Y component for fluorescent materials such as $Tb_3Al_5O_{12}$:Ce and $Lu_3Al_5O_{12}$:Ce. Further, fluorescent materials other than those described above with the same performance, function, and effects as those cited above can also be used.

(Semiconductor Light Emitting Elements)

In the present invention, light emitting diodes are preferably used as the light emitting elements.

The wavelength of the semiconductor light emitting elements can be freely selected. For example, for blue or green light emitting elements, ZnSe or nitride system semiconductors ($In_XAl_YGa_{1-X-Y}N$, $0 \leq X$, $0 \leq Y$, $X+Y \leq 1$) and GaP can be used. For a red light emitting element, systems such as GaAlAs, AlInGaP can be used. In addition, light emitting elements can also be used that are made from materials other than these. The composition, size, and number of light emitting elements employed can be selected appropriate to the application.

For the case of a light emitting element with fluorescent material, a nitride semiconductor ($In_XAl_YGa_{1-X-Y}N$, $0 \leq X$, $0 \leq Y$, $X+Y \leq 1$) that can emit short wavelength light is desirable to enable efficient excitation of the fluorescent material. Various emission wavelengths can be selected depending on the semiconductor layer materials and the crystal mix.

In addition to light in the visible range, light emitting elements that output ultraviolet light or infrared light are also possible. Further, light-receiving devices can be mounted together with light emitting elements.

Second Embodiment

Figure 2A:
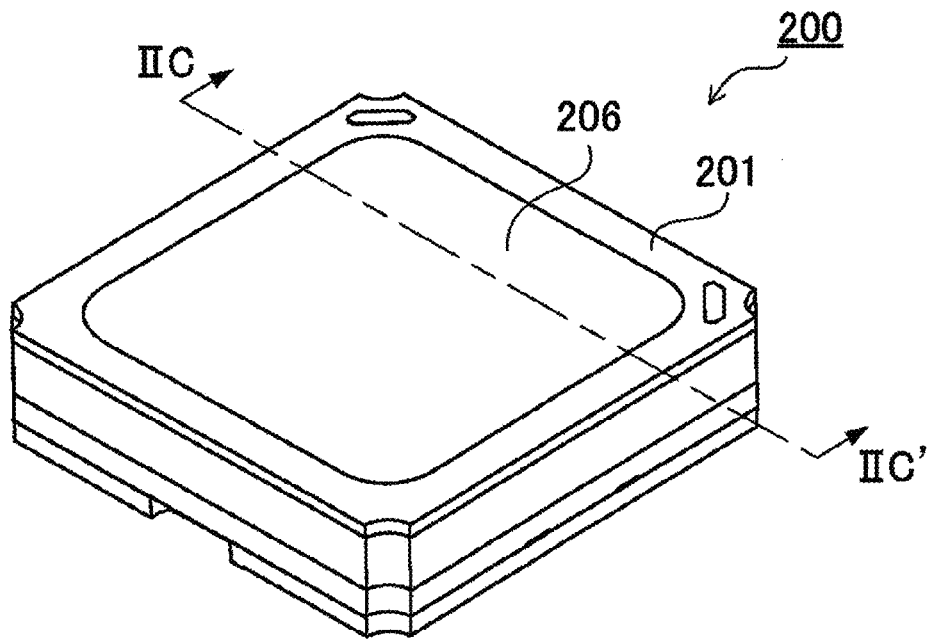
FIG. 2A is an oblique view showing a light emitting device for the second embodiment of the invention.
Figure 2B:
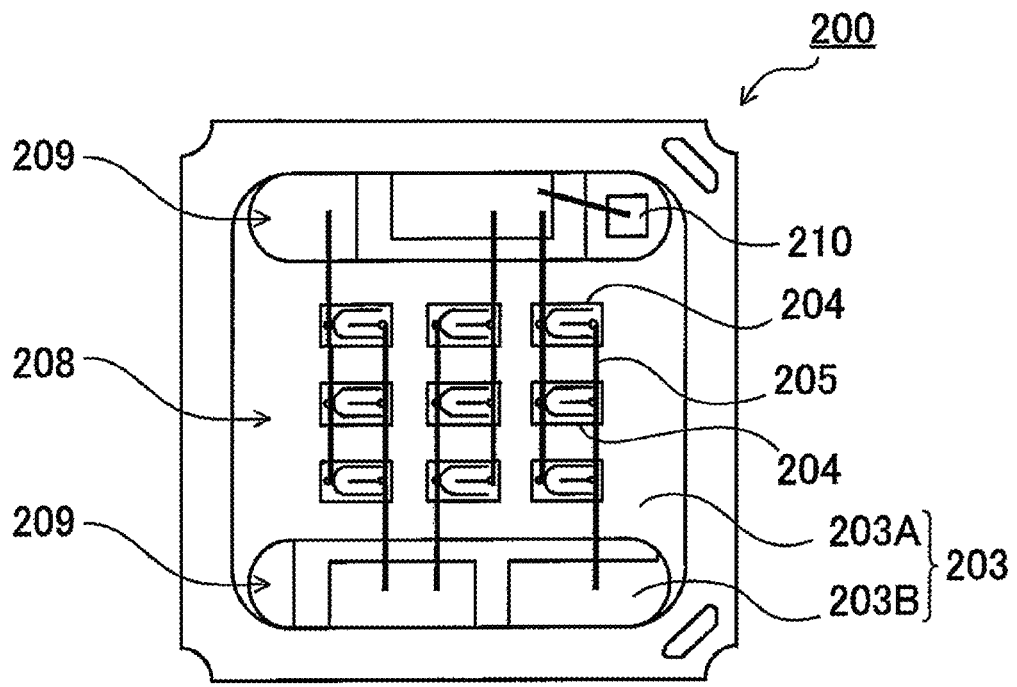
FIG. 2B is a top view showing the inside of the light emitting device of FIG. 2A.
Figure 2C:
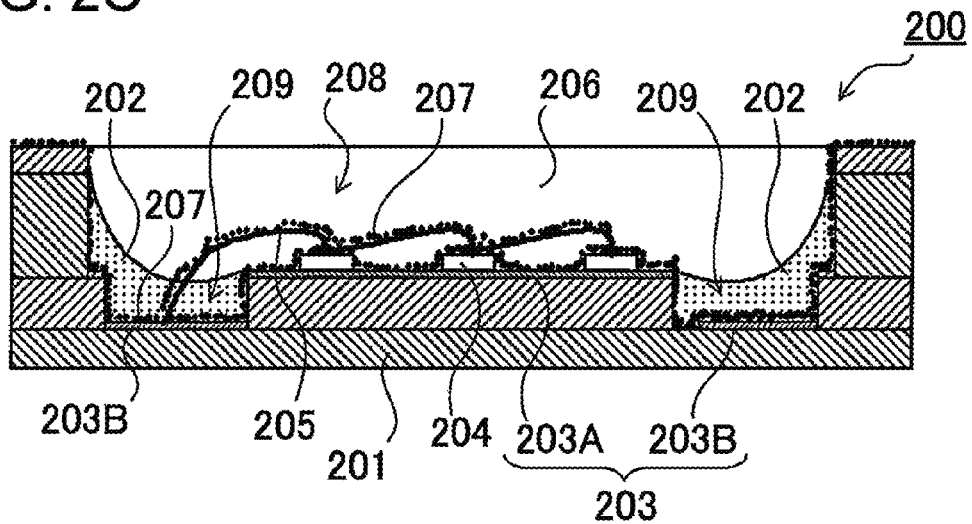
FIG. 2C is a cross-section view through IIC-IIC' on the light emitting device of FIG. 2A.

The light emitting device 200 of the second embodiment is shown in FIGS. 2A, 2B, and 2C. FIG. 2A is an oblique view of the light emitting device 200, FIG. 2B is a plan view of the light emitting device 200 shown in FIG. 2A looking through the encapsulating material 206, and FIG. 2C is a cross-section view through IIC-IIC' on the light emitting device 200 shown in FIG. 2A. In the second embodiment, the light emitting device 200 has a substrate 201 provided with cavities having bottom and side surfaces, a plurality of light emitting elements 204 mounted on metallization 203A established on the bottom surface of a cavity, conducting wire 205 to electrically connect metallization 203B and light emitting elements 204, and encapsulating material 206 that covers components such as light emitting elements 204 and conducting wire 205. The cavities are a first cavity 208 in which the light emitting elements 204 are mounted, and second cavities 209 inside the first cavity 208 having bottom surfaces positioned below the bottom surface of the first cavity 208. Light reflective resin 202 is established in a manner that covers metallization 203B provided on the bottom surfaces of the second cavities 209, insulating material 207 is provided between the metallization 203B and the light reflective resin 202, and that insulating material 207 is provided extending continuously over the light emitting elements 204. In this manner, the insulating material 207 functions as a passivation layer and Ag migration can be suppressed. In addition, depending on the structural materials, the insulating material 207 can improve adhesion with resin regions such as the light reflective resin 202.

The second embodiment is different from the first embodiment in that cavities are formed in the substrate. Materials used in the second embodiment can be the same as those used in the first embodiment. The following describes in detail aspects of the second embodiment that are different from the first embodiment.

(Cavities)

In the light emitting device 200 of the second embodiment, the cavities are a first cavity 208 in which the light emitting elements are mounted, and second cavities 209 inside the first cavity 208 having bottom surfaces positioned below the bottom surface of the first cavity 208. The following describes the cavities in detail.

(First Cavity)

The first cavity has metallization established on its bottom surface and light emitting elements are mounted on top of that metallization. Further, the light emitting device has second cavities with bottom surfaces positioned lower than the bottom surface of the first cavity. In other words, the cavities of this embodiment are formed in two levels, and second cavities with a smaller cavity opening size are formed inside the first cavity with a large cavity opening size.

The bottom surface of the first cavity should be large enough to allocate area required to mount the light emitting elements in a region outside the second cavities. The bottom surface of the first cavity should have a continuous region with an area greater than the area of the bottom surfaces of the light emitting elements to avoid mounting a light emitting element coincident with a second cavity (overlapping or covering a second cavity). For example, nine light emitting elements 204 are mounted in the light emitting device 200 of FIG. 2B, and the first cavity has a bottom surface with an area that allows all nine light emitting elements 204 to be mounted. In the case where a plurality of light emitting elements is mounted, it is preferable to mount all the light emitting elements on a continuous piece of metallization. In the case where light emitting elements are mounted on other materials such as submounts, the bottom surface of the first cavity should have an area that allows the submounts to be attached. It is also possible to provide a plurality of first cavities. For example, two first cavities can be provided with light emitting elements mounted in each cavity, and second cavities can be provide in each first cavity.

Metallization established on the bottom surface of the first cavity can be used as an electrode lead to supply electric power to the light emitting elements. Or, the metallization can be used not to conduct electricity, but rather to improve light reflectivity and heat transfer.

In particular for the case where ceramics are used as the substrate, it is preferable to establish metallization over the entire bottom surface of the first cavity (the entire surface excluding second cavity regions). In this manner, exposure of the substrate can be avoided, and leakage of light can be reduced. For example, as shown in FIG. 2B, metallization 203A is established on essentially the entire bottom surface of the first cavity 208. Here, conducting wire 205 is connected to metallization 203B on the bottom surfaces of the second cavities 209, and these (conducting material) metallization 203B regions are used as electrodes. Metallization 203A on the bottom surface of the first cavity does not contribute to electrical conduction and is primarily used as reflecting material to efficiently reflect light.

The shape of the bottom surface of the first cavity is not limited to the approximately square shape shown in FIG. 2B and can have an arbitrary shape such as circular or elliptical. Similarly, the cavity opening at the top of the cavity can also have an arbitrary shape. Here, although the shape of the bottom surface of the first cavity and the shape of the cavity opening are similar, similar shapes are not always necessary and the bottom surface and the opening of the cavity can have different shapes. For example, the shape of the bottom surface of the cavity can be approximately square and the shape of the cavity opening can be approximately circular.

The side-walls of the first cavity can be perpendicular to, or inclined with respect to the bottom surface, and the first cavity side-walls can be provided continuous with segments of the second cavity side-walls. Further, as shown in FIG. 2C, the second cavities can be established in positions essentially connecting with the side-walls of the first cavity or forming steps with respect to the side-walls of the first cavity. In addition, metallization can be established on the side-walls of the first cavity 208.

(Second Cavities)

The second cavities are cavities formed inside the first cavity, and the second cavities have bottom surfaces disposed below the bottom surface of the first cavity. In the second embodiment, metallization is established on the bottom surfaces of the second cavities, and the insides of the second cavities are filled with light reflective resin. Insulating material is disposed between the metallization and the light reflective resin and that insulating material extends continuously over the light emitting elements.

Metallization established on the bottom surfaces of the second cavities serve as electrodes to supply power to the light emitting elements. The metallization is embedded along with part of the conducting wires inside the light reflective resin. Metallization can be established as a pair of positive and negative electrodes as shown in FIG. 2B or as either a positive or negative electrode inside one second cavity or inside each of a plurality of second cavities. In the case where metallization is established inside a second cavity as either a positive or negative electrode, the other electrode can be metallization established on the bottom surface of the first cavity or it can be metallization established on the bottom surface of another second cavity. In addition, one polarity of the conducting wire from the light emitting elements can be connected to metallization established on the bottom surface of the first cavity (positive electrode), and the other polarity can be connected to second cavity metallization (negative electrode) to implement electrical connection.

One, or two or more second cavities can be provided in the bottom surface of the first cavity, and the second cavity openings are formed with sizes that do not interfere with mounting the light emitting elements. Second cavities can be disposed in arbitrary locations. For example, as shown in FIG. 2B, second cavities 209 with elliptical cavity openings can be provided along each of two sides of the approximately square bottom surface of the first cavity 208 for a total of two second cavities 209. Here, the two second cavities are the same size and shape, and, as shown in FIG. 2B, are located in symmetrical positions. However, second cavities are not limited to this configuration and second cavities can have different cavity opening areas and different sizes, etc. Further, although metallization 203B is established in all of the second cavities 209, all of the metallization does not necessarily have be used for electrical conduction.

As shown in FIG. 2B, when a protection device 210 is mounted inside a second cavity 209, second cavity bottom surface and metallization area is required that is greater than the area of the bottom surface of the protection device 210. Further, in the case of conducting wire 205 attachment, the cavity opening must be wide enough to allow wire-bonding tool access inside the cavity.

(Metallization)

In the second embodiment, metallization is established on the bottom surface of the first cavity and on the bottom surfaces of the second cavities. In particular, it is preferable to establish metallization over essentially the entire bottom surface of the first cavity to prevent light from entering the substrate and to reduce light loss. In this case, metallization on the bottom surface of the second cavities can be used as a pair of electrodes, metallization established on the bottom surface of the first cavity does not have to function as an electrode, and that first cavity metallization can function simply as a high reflectivity material or high-quality heat transfer material. Degradation of this metallization, which is established over a wide area, can be suppressed by covering it with an insulating material that is essentially impermeable to gas. As desirable insulating materials, materials that are the same as those cited for the first embodiment can be utilized. Metallization 203A established in the first cavity and metallization 203B established on the bottom surfaces of the second cavities can be the same material, or preferably, they can be separate materials. Specifically, metallization 203A established in the first cavity in a location that is illuminated by much of the light from the light emitting elements preferably has silver or metals including silver on its surface, and in particular, silver is preferable.

As shown in FIG. 2C, the light reflective resin for the second embodiment fills the inside of the second cavities 209. The light reflective resin fills the second cavities 209 in a manner that has concave curved surface cross-sections and is established extending to the top of the first cavity side-walls, namely, to the upper surface of the substrate 201. Consequently, leakage of light through the substrate 201 can be prevented. This configuration of light reflective resin can be formed by relatively simple techniques by applying a prescribed amount of liquid resin with adjusted viscosity in the second cavities of the substrate to spontaneously spread the liquid resin over the side walls of the cavities.

It is preferable for the light reflective resin to cover not only the bottom surfaces of the second cavities but also essentially the entire side-wall surfaces. It is also preferable for the light reflective resin to cover most of the first cavity side-walls. Further in the case of a plurality of second cavities and, for example, in the case where the second cavities are separated as shown in FIG. 2B, it is preferable to form light reflective resin that fills the second cavities continuously across the bottom surface of the first cavity. In addition, that continuously formed light reflective resin also preferably extends from the bottom surface of the first cavity to the top surface of the substrate. Here, the light reflective resin on the side-walls of the second cavities can be a thickness that allows light from the light emitting elements to be reflected (not transmitted easily). A minimum layer thickness can be specified according to the light transmissivity of the light reflective resin material. Further, light reflective resin layer thickness does not have to be the same over the entire side-walls of the second cavities. For example, layer thickness can gradually become thinner towards the top of a second cavity side-wall. The same light reflective resin materials cited for the first embodiment can be proposed as specific examples of materials to form the light reflective resin for this embodiment.

(Insulating Material)

In the same manner as the first embodiment, the second embodiment also has insulating material established between the light reflective resin and metallization, and that insulating material extends continuously over the light emitting elements. As shown in FIG. 2C, the insulating material is formed on the side-walls of the first cavity and on the side-walls of the second cavities, and is also established on the upper surface of the substrate 201. Here, dense insulating material, which is essentially impermeable to gas, covers the surfaces of the substrate, which is made from relatively porous materials such as ceramics. Consequently, gas ingress from the side and upper surfaces of the substrate as well as from the encapsulating material 206 can be suppressed. Often it is difficult to form insulating material with the same uniform thickness on the bottom and side surfaces of the second cavities and on the bottom surface of the first cavity. For example, for dry process methods such as sputter deposition and physical vapor deposition, regions inside the second cavities can easily become thin due to shadow effects. Conversely, for wet process methods employing liquid coating, cracking and delamination can occur in regions that are too thick due to liquid pooling. However, since the second cavities are filled with light reflective resin, it is not always necessary to form insulating material over the entire inside regions of the second cavities. Assuming metallization in the second cavities is a metal including silver (silver plating), there is no effect even when metal discoloration occurs because of the light reflective resin. Consequently, the most convenient method of forming the insulating material should be chosen from the various methods available.

Third Embodiment

Figure 3:
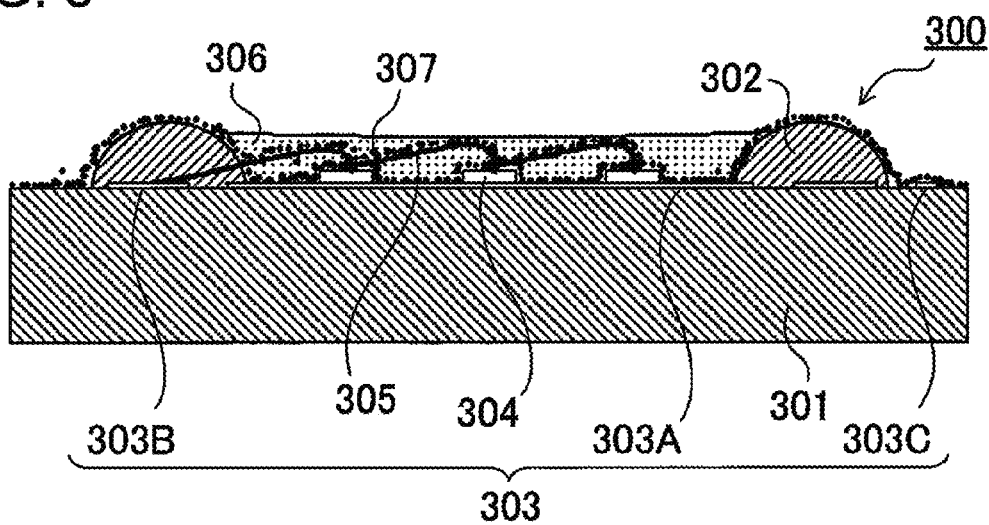
FIG. 3 is a cross-section view of a light emitting device for the third embodiment of the invention.

FIG. 3 shows a cross-section view of a light emitting device 300 for the third embodiment. The external appearance of the light emitting device 300 is similar in form to the light emitting device 100 shown in FIG. 1A, and the difference is the location where the insulating material 307 is formed. Specifically, the light emitting device of the third embodiment has a substrate 301 with metallization 303 (303A, 303B, 303C) that has metal including silver on its surface, light emitting elements 304 mounted on the substrate, conducting wire 305 that electrically connects metallization 303B and light emitting elements 304, encapsulating material 306 that fills the cavity surrounded by light reflective resin 302, light reflective resin 302 established on top of the substrate 301 to reflect light emitted by the light emitting elements 304, and insulating material 307 established on top of the light reflective resin 302. The insulating material 307 is established extending continuously over the light emitting elements 304. With this configuration, degradation of silver plating on the metallization can be suppressed, and the insulating material 307 can function as a passivation layer to suppress Ag migration. Further, depending on the component materials, adhesion of resin regions such as the light reflective resin 302 regions can be improved. In addition, even when resins that easily degrade or become discolored due to oxidation are used as bulk resins for the light reflective resin in particular, the insulating material 307 blocks oxygen ingress and degradation or discoloration of the light reflective resin 302 can be suppressed.

Forth Embodiment

Figure 4:
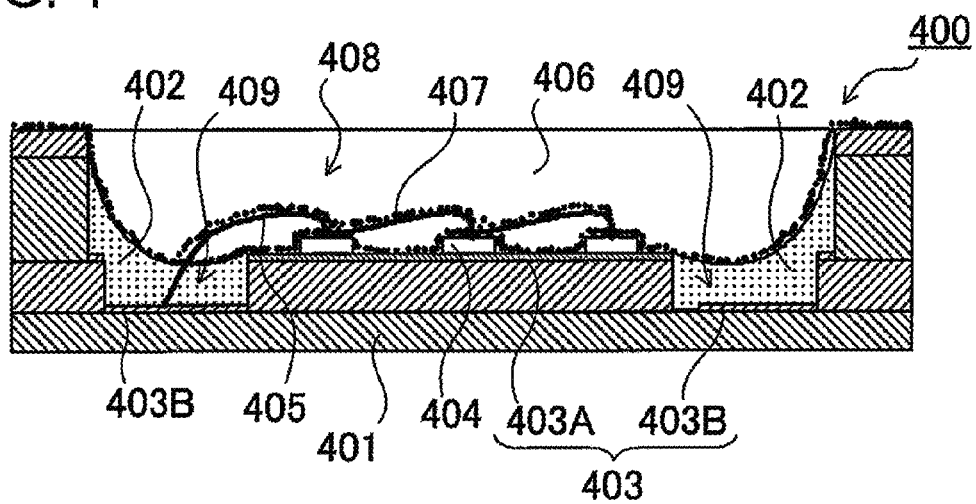
FIG. 4 is a cross-section view of a light emitting device for the fourth embodiment of the invention.

FIG. 4 shows a cross-section view of a light emitting device 400 for the fourth embodiment. The external appearance and internal structure of the light emitting device 400 is similar in form to the light emitting device 200 shown in FIGS. 2A and 2B, and the difference is the location where the insulating material 407 is formed. Specifically, the light emitting device of the fourth embodiment has a substrate 401 with metallization 403 (403A, 403B) that has metal including silver on its surface, light emitting elements 404 mounted on the substrate, conducting wire 405 that electrically connects metallization 403B and light emitting elements 404, and encapsulating material 406 that fills the cavity surrounded by light reflective resin 402. Cavities include a first cavity 408 where light emitting elements 404 are mounted and second cavities 409 inside the first cavity 408 having bottom surfaces that are positioned lower than the bottom surface of the first cavity. Light reflective resin 402 is provided covering metallization 403B established on the bottom surfaces of the second cavities 409, insulating material 407 is provided on the surface of that light reflective resin 402, and that insulating material 407 extends continuously over the light emitting elements 404. With this configuration, degradation of silver plating on the metallization can be suppressed, and the insulating material 407 can function as a passivation layer to suppress Ag migration. Further, depending on the component materials, adhesion of resin regions such as the light reflective resin 402 regions can be improved. In addition, even when resins that easily degrade or become discolored due to oxidation are used as bulk resins for the light reflective resin in particular, the insulating material 407 blocks oxygen ingress and degradation or discoloration of the light reflective resin 402 can be suppressed.

Fifth Embodiment

Figure 5:
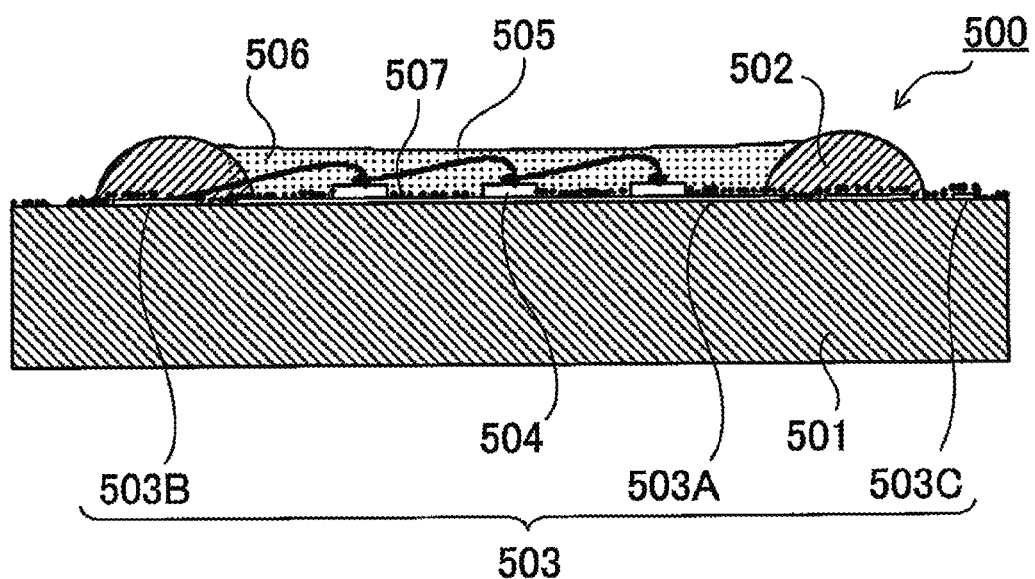
FIG. 5 is a cross-section view of a light emitting device for the fifth embodiment of the invention.

FIG. 5 shows a cross-section view of a light emitting device 500 for the fifth embodiment. The external appearance of the light emitting device 500 is similar in form to the light emitting device 100 shown in FIG. 1A, and the difference is the location where the insulating material is formed. Specifically, the light emitting device of the fifth embodiment has a substrate 501 with metallization 503 (503A, 503B, 503C) that has metal including silver on its surface, light emitting elements 504 mounted on the substrate, conducting wire 505 that electrically connects metallization 503B and light emitting elements 504, encapsulating material 506 that fills the cavity surrounded by light reflective resin 502, light reflective resin 502 established on top of the substrate 501 to reflect light emitted by the light emitting elements 504, and insulating material 507 established between the metallization 503 and the light reflective resin 502. The insulating material 507 is established continuously extending to contact the sides of the light emitting elements 504. In the fifth embodiment, the insulating material is not established on top of the light emitting elements, but rather is established to come in contact with the sides of the light emitting elements. With this configuration, degradation of silver plating on the metallization can be suppressed, and the insulating material 507 can function as a passivation layer to suppress Ag migration. Further, depending on the component materials, adhesion of resin regions such as the light reflective resin 502 regions can be improved.

Sixth Embodiment

Figure 6:
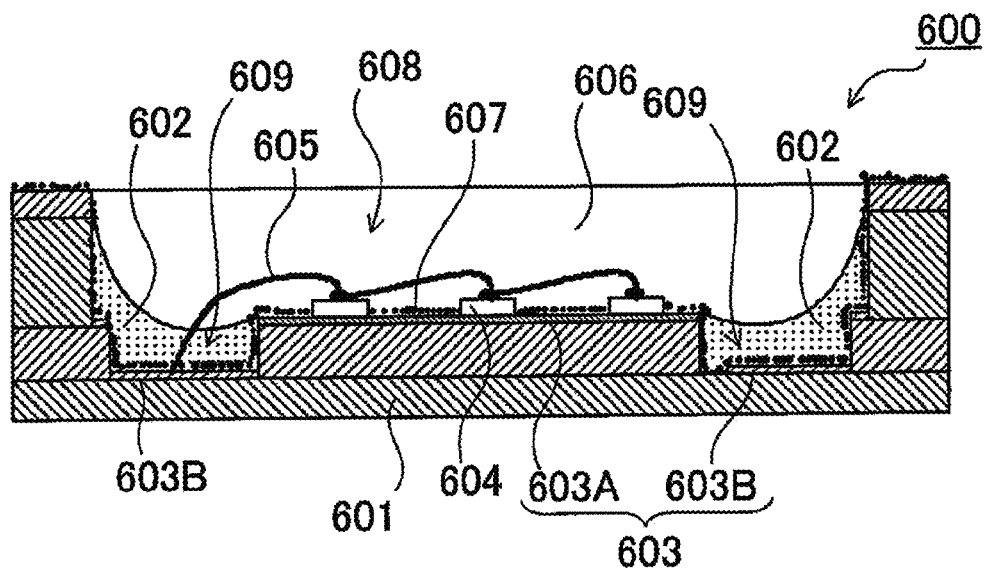
FIG. 6 is a cross-section view of a light emitting device for the sixth embodiment of the invention.

FIG. 6 shows a cross-section view of a light emitting device 600 for the sixth embodiment. The external appearance and internal structure of the light emitting device 600 is similar in form to the light emitting device 200 shown in FIGS. 2A and 2B, and the difference is the location where the insulating material 607 is formed. Specifically, the light emitting device of the sixth embodiment has a substrate 601 with metallization 603 (603A, 603B) that has metal including silver on its surface, light emitting elements 604 mounted on the substrate, conducting wire 605 that electrically connects metallization 603B and light emitting elements 604, and encapsulating material 606 that fills the cavity surrounded by light reflective resin 602. Cavities include a first cavity 608 where light emitting elements 604 are mounted and second cavities 609 inside the first cavity 608 having bottom surfaces that are positioned lower than the bottom surface of the first cavity. Light reflective resin 602 is provided covering metallization 603B established on the bottom surfaces of the second cavities 609, insulating material 607 is provided between the metallization 603B and the light reflective resin 602, and that insulating material 607 extends continuously to contact the sides of the light emitting elements 604. In the sixth embodiment, the insulating material is not established on top of the light emitting elements, but rather is established to come in contact with the sides of the light emitting elements. With this configuration, degradation of silver plating on the metallization can be suppressed, and the insulating material 607 can function as a passivation layer to suppress Ag migration. Further, depending on the component materials, adhesion of resin regions such as the light reflective resin 602 regions can be improved.

INDUSTRIAL APPLICABILITY

The light emitting device and method of manufacture according to the present invention has a structure that makes it difficult for light to leak from the substrate, thereby reducing light loss and allowing realization of a light emitting device that makes higher outputs possible. These light emitting devices can be used in applications such as in various indicator apparatus, lighting equipment, display monitor, backlight source for a liquid crystal display, image acquisition apparatus such as facsimile, copier, and scanner apparatus, and projector apparatus.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the spirit and scope of the invention as defined in the appended claims.

The present application is based on Application No. 2009-019412 filed in Japan on Jan. 30, 2009, and No. 2009-268587 filed in Japan on Nov. 26, 2009, the contents of which are incorporated herein by references.

What is claimed is:

1. A light emitting device comprising:
    a substrate;
    metallization provided on a surface of the substrate that has metal including silver;
    a light emitting element mounted on the substrate;
    conducting wire that electrically connects the metallization and the light emitting element;
    light reflective resin provided on the substrate to reflect light from the light emitting element;
    insulating material that covers at least part of the metallization surfaces and at least part of the conducting wire, and the insulating material being in direct contact with the conducting wire; and
    an encapsulating material provided on the surface of the substrate to encapsulate the light emitting element,
    wherein the insulating material is established to come in contact with a side of the light emitting element,
    wherein the insulating material and the encapsulating material are made of different materials, and
    wherein the insulating material extends beneath the light reflective resin, the insulating material being provided between the light reflective resin and the substrate.

2. The light emitting device as cited in claim 1 wherein the insulating material is established to cover the surfaces of conducting wire continuously from the upper surface of the light emitting element.

3. The light emitting device as cited in claim 1 wherein the insulating material covers essentially the entire upper surface of the substrate.

4. The light emitting device as cited in claim 1 wherein the encapsulating material encapsulates essentially all surfaces of the conducting wire, and at least part of the insulating material.

5. The light emitting device as cited in claim 1 wherein the insulating material has light transparency.

6. The light emitting device as cited in claim 1 wherein the insulating material is an inorganic compound.

7. The light emitting device as cited in claim 1 wherein the insulating material is $SiO_2$.

8. The light emitting device as cited in claim 1 wherein the light emitting element is mounted on the metallization, and the metallization functions as an electrode.

9. The light emitting device as cited in claim 1, wherein the insulating material is formed to have a thickness that is approximately 1 nm to 100 nm.

10. The light emitting device as cited in claim 1, wherein the light reflective resin has a curved upper surface, when viewed in a cross-sectional plane extending perpendicularly through an upper surface of the light emitting element.

11. The light emitting device as cited in claim 10, wherein the curved upper surface is convex.

12. The light emitting device as cited in claim 1, wherein the insulating material covers substantially an entirety of the conducting wire.

13. The light emitting devices as cited in claim 1, wherein the light emitting element is nitride semiconductor.

14. A light emitting device comprising:
    a substrate;
    metallization provided on the surface of the substrate that has metal including silver;
    a light emitting element mounted on the substrate;
    conducting wire that electrically connects the metallization and the light emitting element;
    light reflective resin provided on the substrate to reflect light from the light emitting element; and
    insulating material that covers at least part of the metallization surfaces;
    wherein the insulating material is established to come in contact with the side of the light emitting element, and
    wherein the substrate has cavities with bottom and side surfaces; the cavities include a first cavity where light emitting element is mounted, and second cavities inside the first cavity having bottom surfaces positioned lower than the first cavity; and the light reflective resin is established on metallization inside the second cavities.

15. The light emitting device as cited in claim 14 wherein the insulating material covers side-walls of the second cavities that connect with the first cavity.

16. The light emitting device as cited in claim 14 wherein the light reflective resin extends upwards from the second cavities to a position above the bottom surface of first cavity.

17. The light emitting devices as cited in claim 14, wherein the light emitting element is nitride semiconductor.

18. The light emitting devices as cited in claim 14, wherein the insulating material is established on a surface of the light reflective resin, and the insulating material extends continuously over an upper surface of the light emitting element.

19. A light emitting device comprising:
    a substrate;
    metallization provided on a surface of the substrate that has metal including silver;
    a light emitting element mounted on the substrate;
    conducting wire that electrically connects the metallization and the light emitting element;
    light reflective resin provided on the substrate to reflect light from the light emitting element;
    insulating material that covers at least part of the metallization surfaces and at least part of the conducting wire, and the insulating material being in direct contact with the conducting wire; and
    an encapsulating material provided on the surface of the substrate to encapsulate the light emitting element,
    wherein the insulating material is established continuously over metallization surfaces and on an upper surface of the light emitting element, wherein the insulating material and the encapsulating material are made of different materials, and wherein the insulating material extends beneath the light reflective resin, the insulating material being provided between the light reflective resin and the substrate.

20. The light emitting device as cited in claim 19 wherein the insulating material is established intervening between the metallization and the light reflective resin, and the insulating material extends continuously over the upper surface of the light emitting element.

21. The light emitting device as cited in claim 19, wherein the insulating material is formed to have a thickness that is approximately 1 nm to 100 nm.

22. The light emitting device as cited in claim 19, wherein the light reflective resin has a curved upper surface, when viewed in a cross-sectional plane extending perpendicularly through an upper surface of the light emitting element.

23. The light emitting device as cited in claim 22, wherein the curved upper surface is convex.

24. The light emitting device as cited in claim 19, wherein the insulating material covers substantially an entirety of the conducting wire.

25. The light emitting devices as cited in claim 19, wherein the light emitting element is nitride semiconductor.

26. A light emitting device comprising:
a substrate;
metallization provided on a surface of the substrate that has metal including silver;
a light emitting element mounted on the substrate;
light reflective resin provided on the substrate to reflect light from the light emitting element; and
insulating material that covers at least part of the metallization surfaces;
wherein the insulating material is established to come in contact with a side of the light emitting element,
wherein the light reflective resin has a curved upper surface, when viewed in a cross-sectional plane extending perpendicularly through an upper surface of the light emitting element, and
wherein the insulating material extends beyond an outer perimeter of the light reflective resin.

27. The light emitting device as cited in claim 26, wherein the curved upper surface is concave.

28. The light emitting device as cited in claim 26, wherein the curved upper surface is convex.

29. The light emitting devices as cited in claim 26, wherein the light emitting element is nitride semiconductor.

30. The light emitting devices as cited in claim 26, wherein the insulating material is established on the curved upper surface of the light reflective resin, and the insulating material extends continuously over the upper surface of the light emitting element.

31. A light emitting device comprising:
a substrate;
metallization provided on a surface of the substrate that has metal including silver;
a light emitting element mounted on the substrate;
light reflective resin provided on the substrate to reflect light from the light emitting element; and
insulating material that covers at least part of the metallization surfaces;
wherein the insulating material is established continuously over metallization surfaces and on an upper surface of the light emitting element,
wherein the light reflective resin has a curved upper surface, when viewed in a cross-sectional plane extending perpendicularly through the upper surface of the light emitting element, and
wherein the insulating material extends beyond an outer perimeter of the light reflective resin.

32. The light emitting device as cited in claim 31, wherein the curved upper surface is concave.

33. The light emitting device as cited in claim 31, wherein the curved upper surface is convex.

34. The light emitting devices as cited in claim 31, wherein the light emitting element is nitride semiconductor.

35. The light emitting devices as cited in claim 31, wherein the insulating material is established on the curved upper surface of the light reflective resin, and the insulating material extends continuously over the upper surface of the light emitting element.

36. A light emitting device comprising:
a substrate;
metallization provided on a surface of the substrate that has metal including silver;
a light emitting element mounted on the substrate;
light reflective resin provided on the substrate to reflect light from the light emitting element; and
insulating material that covers at least part of the metallization surfaces;
wherein the insulating material is established to come in contact with a side of the light emitting element, and
wherein the insulating material extends beneath the light reflective resin, the insulating material being provided between the light reflective resin and the substrate.

37. The light emitting device as cited in claim 36, wherein the insulating material is formed to have a thickness that is approximately 1 nm to 100 nm.

38. The light emitting device as cited in claim 36, wherein the insulating material extends beyond an outer perimeter of the light reflective resin.

39. The light emitting devices as cited in claim 36, wherein the light emitting element is nitride semiconductor.

40. A light emitting device comprising:
a substrate;
metallization provided on a surface of the substrate that has metal including silver;
a light emitting element mounted on the substrate;
light reflective resin provided on the substrate to reflect light from the light emitting element; and
insulating material that covers at least part of the metallization surfaces;
wherein the insulating material is established continuously over metallization surfaces and on an upper surface of the light emitting element, and
wherein the insulating material extends beneath the light reflective resin, the insulating material being provided between the light reflective resin and the substrate.

41. The light emitting device as cited in claim 40, wherein the insulating material is formed to have a thickness that is approximately 1 nm to 100 nm.

42. The light emitting device as cited in claim 40, wherein the insulating material extends beyond an outer perimeter of the light reflective resin.

43. The light emitting devices as cited in claim 40, wherein the light emitting element is nitride semiconductor.

* * * * *